United States Patent

Small

[11] Patent Number: 5,947,435
[45] Date of Patent: Sep. 7, 1999

[54] VEHICLE COMPONENT MOUNTING BRACKET

[75] Inventor: Robert Clare Small, Charlotte, Mich.

[73] Assignee: General Motors Corporation, Detroit, Mich.

[21] Appl. No.: 08/999,522

[22] Filed: Aug. 6, 1997

[51] Int. Cl.[6] .................................................. H05K 1/14
[52] U.S. Cl. ................................ 248/309.1; 248/221.11; 248/314; 361/740
[58] Field of Search ........................... 248/309.1, 221.11, 248/314, 906, 27.1; 361/728, 740, 759, 726, 727; 220/480, 481

[56] References Cited

U.S. PATENT DOCUMENTS

| | | | |
|---|---|---|---|
| 3,212,661 | 10/1965 | Adell | 220/481 X |
| 4,747,570 | 5/1988 | Takahashi | 248/309.1 |
| 5,478,037 | 12/1995 | Haltof | 248/309.1 X |
| 5,480,115 | 1/1996 | Haltof | 248/309.1 X |

*Primary Examiner*—Ramon O. Ramirez
*Assistant Examiner*—Stephen S. Wentsler
*Attorney, Agent, or Firm*—Charles E. Leahy

[57] ABSTRACT

A box-shaped component is mounted within a vehicle body by a bracket attached to the vehicle and having slide surfaces which slidably receive the component. A retaining element is provided on the component. A retainer member, preferably a lever, is movably mounted on the bracket for movement between retaining and releasing positions with respect to the retaining element of the component. The retainer member has a first engaging element capturing the retaining element of the component at a first position of partial insertion of the component into the bracket. The retainer member also has a second engaging element for capturing the retaining element of the component at a second position of full insertion of the component into the bracket. The retainer member is preferably a lever. The bracket and retainer lever are preferably of molded plastic construction and integrally molded detent features releasably retain the retainer lever at the retaining position, but permit release of the retainer lever to the releasing position to disengage from the retaining element carried by the component. The bracket has an integrally molded snap tab which engages the component upon insertion to the second position to retain the component independent of the engagement of the retainer lever with the retainer element of the component. The retaining element carried by the component is preferably an integral abutment which projects therefrom and the first and second engaging elements of the retainer lever are receptacles molded integrally with the retainer lever.

7 Claims, 3 Drawing Sheets

VEHICLE COMPONENT MOUNTING BRACKET

TECHNICAL FIELD

The invention relates to a bracket for installing a component in a motor vehicle, and, more particularly, provides a bracket for temporarily mounting the component at a first position and then subsequently mounting the component at a second and final position.

BACKGROUND OF THE INVENTION

Modern motor vehicles are assembled from a multitude of individual components which are attached to the vehicle body by assembly workers.

One example of a component to be attached to a motor vehicle is a box-shaped electronic control module which includes an aluminum housing containing circuit boards and other electrical equipment. An electrical connector projects through the aluminum housing to receive a mating connector attached to a wiring harness.

It would be desirable to facilitate the installation of a component such as an electronic control module on the vehicle body by the provision of a mounting bracket by which the module may be mounted at a relatively accessible first position in which the electrical connectors may be readily mated and then subsequently the component is moved to a final mounted position.

SUMMARY OF THE INVENTION

According to the invention, a box-shaped component is mounted within a vehicle body by a bracket attached to the vehicle and having slide surfaces which slidably receive the component. A retaining element is provided on the component. A retainer member, preferably a lever, is movably mounted on the bracket for movement between retaining and releasing positions with respect to the retaining element of the component. The retainer member has a first engaging element capturing the retaining element of the component at a first position of partial insertion of the component into the bracket. The retainer member also has a second engaging element for capturing the retaining element of the component at a second position of full insertion of the component into the bracket. The retainer member is preferably a lever. The bracket and retainer lever are preferably of molded plastic construction and integrally molded detent features releasably retain the retainer lever at the retaining position, but permit release of the retainer lever to the releasing position to disengage from the retaining element carried by the component. The bracket has an integrally molded snap tab which engages the component upon insertion to the second position to retain the component independent of the engagement of the retainer lever with the retainer element of the component. The retaining element carried by the component is preferably an integral abutment which projects therefrom and the first and second engaging elements of the retainer lever are receptacles molded integrally with the retainer lever.

BRIEF DESCRIPTION OF THE DRAWINGS

These and other features, objects and advantages of the invention will become apparent upon consideration of the Description of the Preferred Embodiment and the appended drawings in which.

DESCRIPTION OF THE PREFERRED EMBODIMENT

Figure 1:
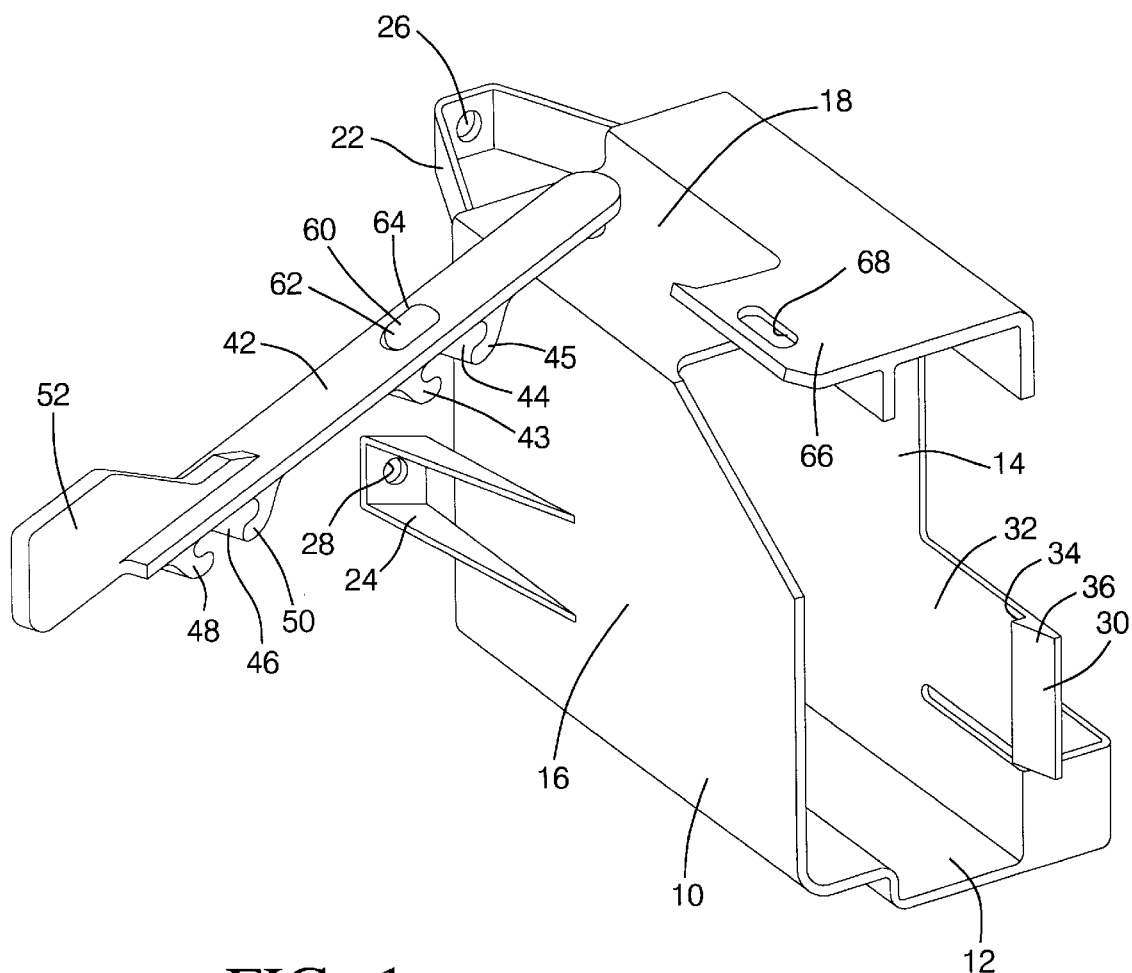
FIG. 1 is a perspective view of the bracket of this invention.

As seen in FIG. 1, a bracket 10 is constructed of molded plastic and has the general shape of an open box including a bottom wall 12, side walls 14 and 16 and top wall 18. Mounting legs 22 and 24 are molded integrally with the bracket 10 and have bolt holes 26 and 28 for receiving bolts to attach the bracket 10 to a motor vehicle body. The wall 14 of the bracket has an integrally molded snap tab 30 which includes a resilient finger 32, shoulder 34 and cam surface 36.

Figure 4:
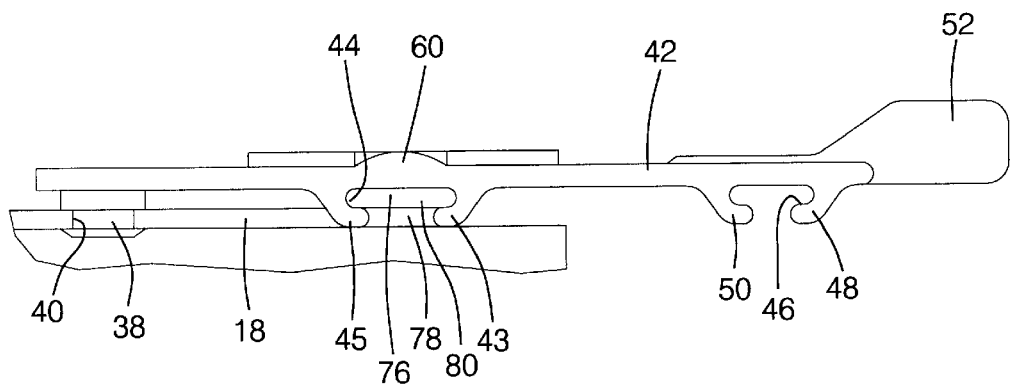
FIG. 4 is a fragmentary side elevation view showing the component fully inserted and engaged by the retaining lever.

A retainer lever 42, also of molded plastic, has an integral pivot shaft 38, seen in FIG. 4, which projects through a aperture 40 in the top wall 20 of bracket 10 to pivotably mount the lever 42 on the bracket 10. Retainer lever 42 has an engaging element, in particular, a first receptacle slot 46 defined by integrally molded opposed facing in-turned shoulders 48 and 50. Lever 42 also has a second engaging element, particularly a receptacle slot 44 defined by opposed facing in-turned shoulders 43 and 44. A handle 52 is molded integral with retainer lever 42. In addition, the retainer lever 42 has an abutment 60 molded on the top surface thereof and having a inclined surface 62 on the face thereof and a locking shoulder 64.

As seen in FIG. 1, the top wall 20 of the bracket 10 also has an integral tab 66 having a slot 68 for receiving the abutment 60 of retainer lever 42 when the retainer lever is pivoted to the retaining position of FIG. 4. The abutment 60 and slot 68 cooperate to provide a first detent for retaining the retainer lever 42 at the retaining position.

Figure 2:
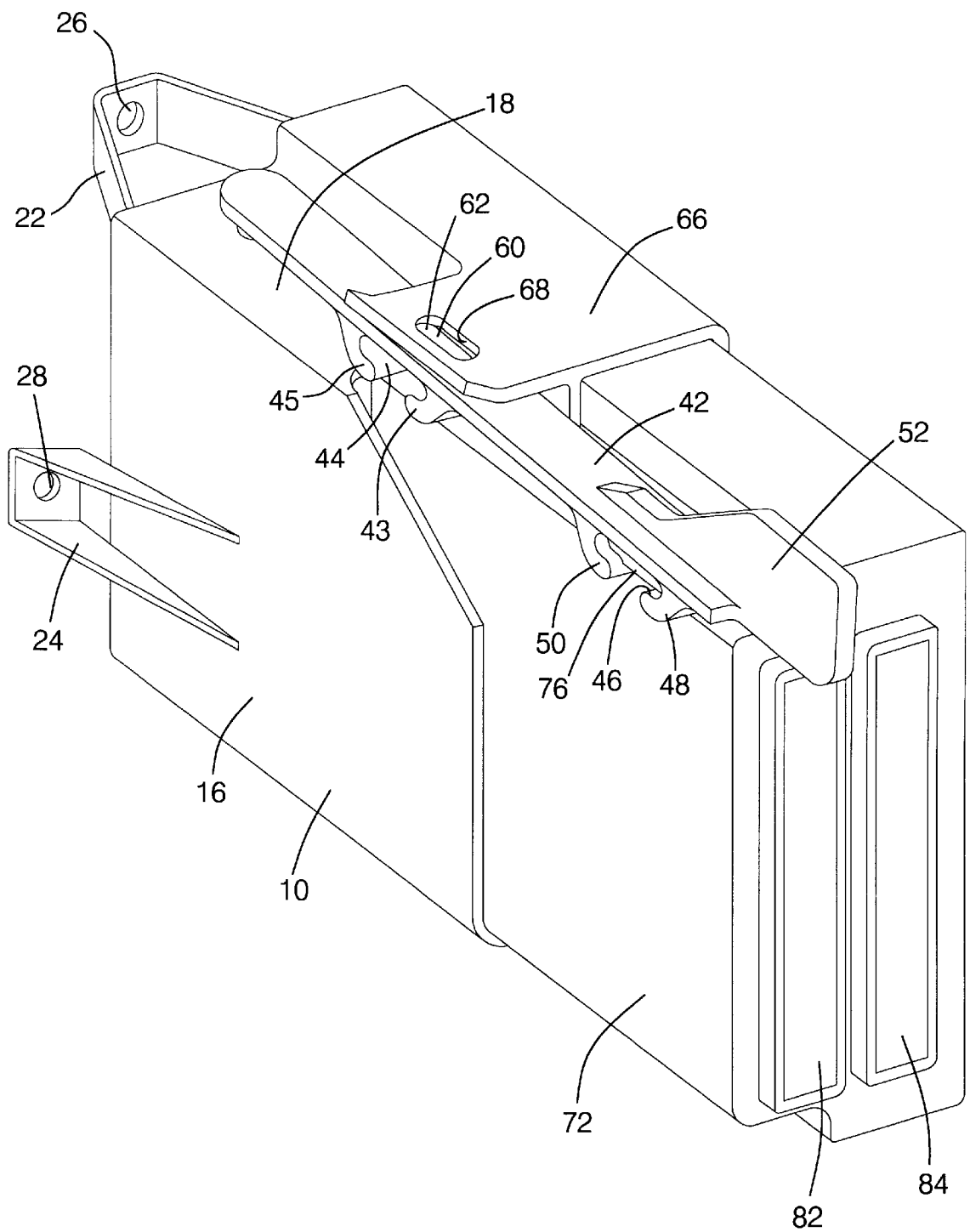
FIG. 2 is a perspective view showing the component slid part way into the bracket and retained therein at this first position by a retaining lever.

Referring to FIG. 2, it is seen that a vehicle component, in this case an electronic control module 72, has a box-like shape and fits closely within the confines of the bracket 10 such that the component 72 is slidably received by the walls 12, 14, 16 and 18. FIG. 2 shows the component 72 slid part way into the bracket 10 and the retainer lever 42 pivoted to its retaining position in which the receptacle slot 46 of the retainer lever 42 has come into capturing engagement with a retaining element 76 of the component 72. As seen in FIG. 4, this retaining element 76 includes a stem 78 and head 80. In addition, as shown in FIGS. 2 and 4, the abutment 60 of the lever 42 has become captured within the slot 68 of the tab 66 of bracket 10. Engagement of the abutment 60 within the aperture 68 is facilitated by the inclined surface 62 of the lever 42 which interacts with the underside of tab 66 to yieldably raise the tab until the abutment and its locking shoulder 64 fully enter the slot 68.

As seen in FIG. 2, the capture of the retaining element 76 within the first engaging element provided by receptacle slot 46 of the lever 42 retains the component 72 at a position of partial insertion into the bracket 10 so that the electrical connectors 82 and 84 of the component 72 are positioned in a relatively accessible location to facilitate the connection of mating electrical connectors of a wiring harness onto the connectors 82 and 84.

Figure 3:
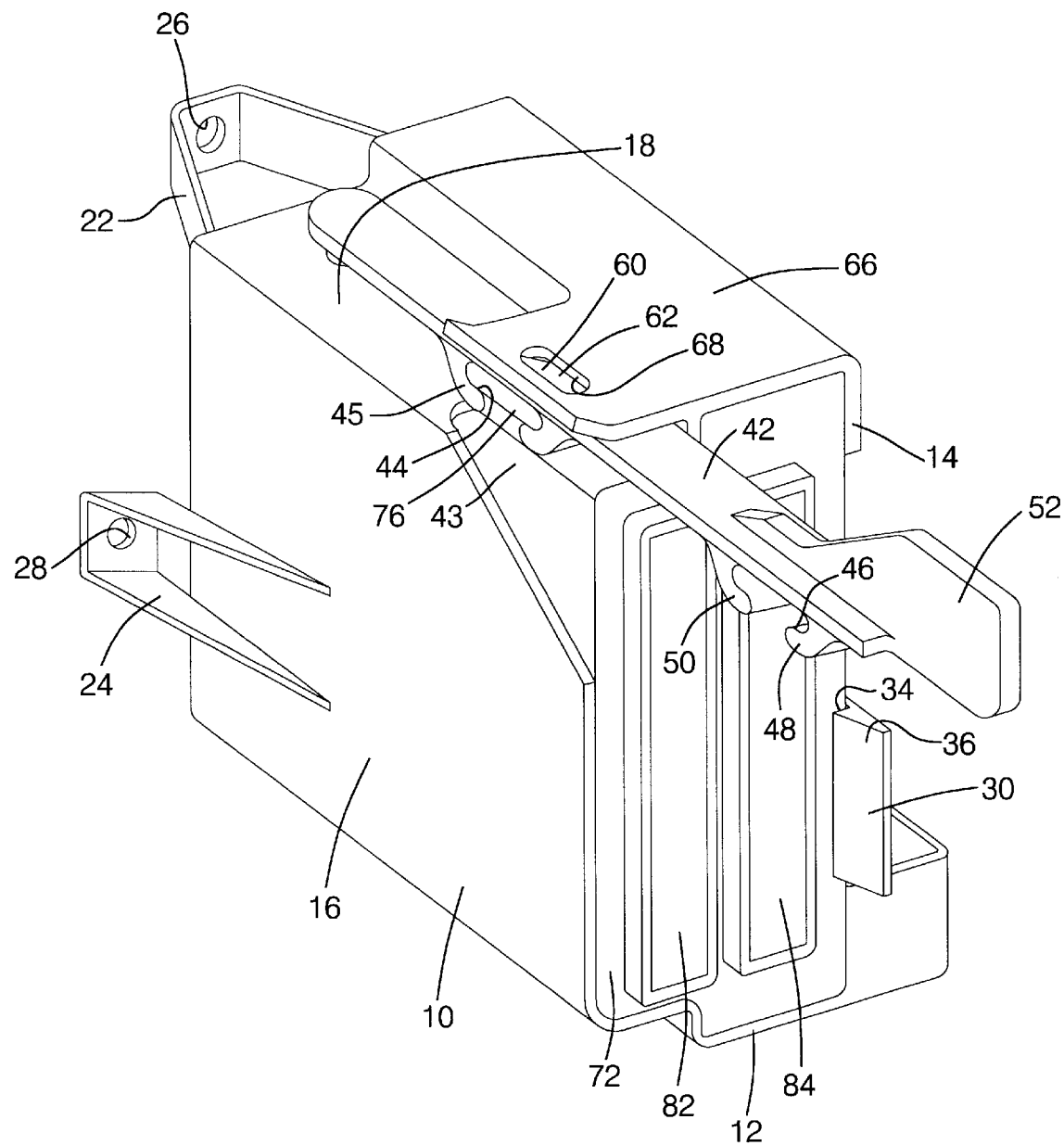
FIG. 3 is a perspective view showing full insertion of the component into the bracket with the component retained at the final mounted position by the retaining lever and an integrally molded snap tab of the bracket.

Subsequent to the installation of the connectors, the retainer lever 42 may be swung leftwardly from its retaining position of FIG. 2 to the releasing position of FIG. 1. Accordingly, the receptacle slot 46 is carried away from the retaining element 76 of the component 72 so that the component 72 may be slid further into the bracket 10 to a fully inserted position of FIG. 3. The lever 42 is then returned to the retaining position as shown in FIG. 3 in which the receptacle slot 44 captures the retaining element 76 of the component 72 to retain the component 72 at the fully indented and installed position of FIG. 3. Furthermore, as seen in FIG. 3, the full insertion of the component 72 permits the shoulder 34 of snap tab 30 to become engaged with the component 72 and thereby provide a second detent for retaining the component 72 independently of the retention thereof provided by the lever 42.

Thus, it is seen that the invention provides a new and improved bracket for mounting a component in a motor vehicle body.

I claim:

1. In combination, a component and a bracket for mounting the component in a vehicle body comprising:

said bracket for attaching to the vehicle body and said bracket slidably receiving the component to house the component within the bracket;

a retaining element carried by the component;

a retainer lever movably mounted on the bracket for movement between retaining and releasing positions with respect to the retaining element of the component, said retainer lever having a first engaging element for capturing the retaining element of the component at a first position of partial insertion of the component into the bracket and a second engaging element for capturing the retaining element of the component at a second position of full insertion of the component into the bracket.

2. The combination of claim 1 further comprising a first detent acting between the retainer lever and the bracket to releasably retain the retainer lever at the retaining position.

3. The combination of claim 1 further comprising a second detent acting between the bracket and the component to releasably retain the component at the second position thereof independent of the retaining lever.

4. The combination of claim 3 further comprising the bracket being of molded plastic construction and the second detent comprising an integrally molded snap tab for engaging the component in the second position and being yieldable to release the component for removal of the component from the bracket.

5. The combination of claim 1 further comprising said retaining element carried by the component being a projecting abutment and the first and second engaging elements of the retainer lever being receptacles integrally formed in the retainer lever.

6. In combination, a box-like component and a bracket for mounting the component on a vehicle body comprising:

said bracket being of molded plastic and for attaching to the vehicle and said bracket slidably receiving the component to house the component within the bracket;

a retaining element carried by the component;

a retainer lever pivotally mounted on the bracket for movement between retaining and releasing positions with respect to the retaining element of the component, said retainer having a first engaging element for capturing the retaining element of the component at a first position of partial insertion of the component to the bracket and a second engaging element for capturing the retaining element of the component to a second position of full insertion of the component into the bracket;

a first detent acting between the retainer lever and the bracket to releasably retain the retainer lever at the retaining position;

and a snap tab molded integrally with the bracket for engaging the component in the second position and being yieldable to release the component for removal of the component from the bracket.

7. The combination of claim 6 further comprising said retainer lever carried by the bracket being of molded plastic and having an integral molded pivot pivotally mounting the retainer lever on the bracket.

* * * * *